(12) United States Patent
Chiang et al.

(10) Patent No.: US 12,068,383 B2
(45) Date of Patent: Aug. 20, 2024

(54) WRAP AROUND SILICIDE FOR FinFETs

(71) Applicant: Taiwan Semiconductor Manufacturing Co., Ltd., Hsinchu (TW)

(72) Inventors: Kuo-Cheng Chiang, Zhubei (TW); Chi-Wen Liu, Hsinchu (TW); Ying-Keung Leung, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/813,110

(22) Filed: Jul. 18, 2022

(65) Prior Publication Data
US 2022/0352329 A1 Nov. 3, 2022

Related U.S. Application Data

(60) Continuation of application No. 16/883,227, filed on May 26, 2020, now Pat. No. 11,437,479, which is a (Continued)

(51) Int. Cl.
*H01L 29/417* (2006.01)
*H01L 21/8234* (2006.01)
(Continued)

(52) U.S. Cl.
CPC ............ *H01L 29/41791* (2013.01); *H01L 21/823418* (2013.01); *H01L 21/823431* (2013.01); *H01L 21/823468* (2013.01); *H01L 21/823481* (2013.01); *H01L 21/823814* (2013.01); *H01L 21/823821* (2013.01); *H01L 21/845* (2013.01); *H01L 27/0886* (2013.01); (Continued)

(58) Field of Classification Search
CPC ........... H01L 29/41791; H01L 27/0924; H01L 29/0649; H01L 29/41725; H01L 29/456; H01L 29/6656; H01L 29/66795; H01L 21/823468; H01L 21/823864; H01L 29/66553
See application file for complete search history.

(56) References Cited

U.S. PATENT DOCUMENTS

| | | | | |
|---|---|---|---|---|
| 7,005,700 B2 * | 2/2006 | Lee | .................. | H01L 29/42324 257/314 |
| 7,385,237 B2 * | 6/2008 | Lee | ..................... | H01L 29/7851 257/213 |

(Continued)

FOREIGN PATENT DOCUMENTS

| | | |
|---|---|---|
| CN | 102034863 A | 4/2011 |
| CN | 103681347 A | 3/2014 |
| KR | 20050090126 A | 9/2005 |

*Primary Examiner* — Eduardo A Rodela
(74) *Attorney, Agent, or Firm* — Slater Matsil, LLP

(57) ABSTRACT

A method includes forming a gate stack on a middle portion of s semiconductor fin, and forming a first gate spacer on a sidewall of the gate stack. After the first gate spacer is formed, a template dielectric region is formed to cover the semiconductor fin. The method further includes recessing the template dielectric region. After the recessing, a second gate spacer is formed on the sidewall of the gate stack. The end portion of the semiconductor fin is etched to form a recess in the template dielectric region. A source/drain region is epitaxially grown in the recess.

20 Claims, 24 Drawing Sheets

Related U.S. Application Data continuation of application No. 16/236,783, filed on Dec. 31, 2018, now Pat. No. 10,665,718, which is a continuation of application No. 15/859,863, filed on Jan. 2, 2018, now Pat. No. 10,170,365, which is a continuation of application No. 15/221,123, filed on Jul. 27, 2016, now Pat. No. 9,876,108, which is a division of application No. 14/739,294, filed on Jun. 15, 2015, now Pat. No. 9,418,897.

(51) Int. Cl.

| | |
|---|---|
| *H01L 21/8238* | (2006.01) |
| *H01L 21/84* | (2006.01) |
| *H01L 27/088* | (2006.01) |
| *H01L 27/092* | (2006.01) |
| *H01L 27/12* | (2006.01) |
| *H01L 29/06* | (2006.01) |
| *H01L 29/45* | (2006.01) |
| *H01L 29/66* | (2006.01) |
| *H01L 29/78* | (2006.01) |
| *H10B 12/00* | (2023.01) |

(52) U.S. Cl.
CPC ...... *H01L 27/0924* (2013.01); *H01L 27/1211* (2013.01); *H01L 29/0649* (2013.01); *H01L 29/41725* (2013.01); *H01L 29/41783* (2013.01); *H01L 29/456* (2013.01); *H01L 29/6656* (2013.01); *H01L 29/66575* (2013.01); *H01L 29/66636* (2013.01); *H01L 29/66772* (2013.01); *H01L 29/66795* (2013.01); *H01L 29/7831* (2013.01); *H01L 29/785* (2013.01); *H10B 12/056* (2023.02); *H01L 29/66545* (2013.01)

(56) References Cited

U.S. PATENT DOCUMENTS

| | | | |
|---|---|---|---|
| 8,487,378 B2 | 7/2013 | Goto et al. | |
| 8,652,894 B2 | 2/2014 | Lin et al. | |
| 8,729,634 B2 | 5/2014 | Shen et al. | |
| 8,826,213 B1 | 9/2014 | Ho et al. | |
| 8,835,232 B2 * | 9/2014 | Jagannathan | H01L 27/1203 438/151 |
| 8,877,592 B2 * | 11/2014 | Tsai | H01L 29/16 438/283 |
| 8,887,106 B2 | 11/2014 | Ho et al. | |
| 8,941,214 B2 * | 1/2015 | Sell | H01L 29/66772 257/353 |
| 9,252,244 B2 * | 2/2016 | Kim | H01L 29/66545 |
| 9,318,567 B2 | 4/2016 | Chien et al. | |
| 9,385,218 B1 | 7/2016 | Cheng et al. | |
| 9,412,660 B1 | 8/2016 | Xie et al. | |
| 9,418,897 B1 | 8/2016 | Ching et al. | |
| 9,431,537 B2 * | 8/2016 | Maeda | H01L 29/161 |
| 9,633,835 B2 | 4/2017 | Glass et al. | |
| 9,711,410 B2 | 7/2017 | Sell | |
| 9,728,464 B2 | 8/2017 | Glass et al. | |
| 9,876,108 B2 * | 1/2018 | Ching | H01L 29/66772 |
| 10,170,365 B2 | 1/2019 | Ching et al. | |
| 10,665,718 B2 | 5/2020 | Chiang et al. | |
| 2004/0259315 A1 | 12/2004 | Sakaguchi et al. | |
| 2005/0199948 A1 * | 9/2005 | Lee | H01L 29/41791 257/327 |
| 2007/0210355 A1 | 9/2007 | Izumida | |
| 2010/0213548 A1 | 8/2010 | Chang et al. | |
| 2011/0084336 A1 * | 4/2011 | Luning | H01L 29/7842 257/E21.415 |
| 2011/0193141 A1 | 8/2011 | Lin et al. | |
| 2011/0291190 A1 | 12/2011 | Xiao et al. | |
| 2013/0146950 A1 | 6/2013 | Li | |
| 2013/0221447 A1 | 8/2013 | Lee et al. | |
| 2013/0248999 A1 | 9/2013 | Glass et al. | |
| 2013/0285143 A1 | 10/2013 | Oh et al. | |
| 2014/0027860 A1 | 1/2014 | Glass et al. | |
| 2014/0065775 A1 | 3/2014 | Chien et al. | |
| 2014/0065782 A1 | 3/2014 | Lu et al. | |
| 2014/0099793 A1 | 4/2014 | Sun et al. | |
| 2014/0239395 A1 | 8/2014 | Basker et al. | |
| 2014/0282326 A1 | 9/2014 | Chen et al. | |
| 2014/0363935 A1 | 12/2014 | Fu et al. | |
| 2015/0069473 A1 * | 3/2015 | Glass | H01L 29/785 257/288 |
| 2015/0255556 A1 * | 9/2015 | Cheng | H01L 29/7813 438/587 |
| 2016/0049488 A1 | 2/2016 | Shen et al. | |
| 2018/0019170 A1 | 1/2018 | Glass et al. | |

\* cited by examiner

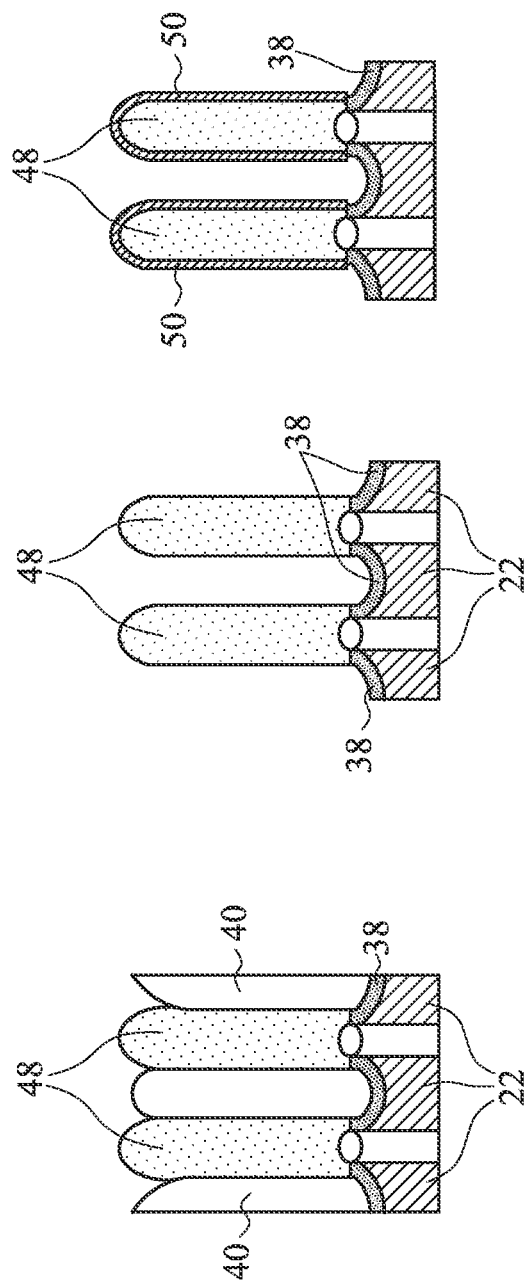

WRAP AROUND SILICIDE FOR FinFETs

PRIORITY CLAIM AND CROSS-REFERENCE

This application is a continuation of U.S. patent application Ser. No. 16/883,227, entitled "Wrap Around Silicide for FinFETs," filed on May 26, 2020, which is a continuation of U.S. patent application Ser. No. 16/236,783, entitled "Wrap Around Silicide for FinFETs," filed on Dec. 31, 2018, now U.S. Pat. No. 10,665,718 issued May 26, 2020, which is a continuation of U.S. patent application Ser. No. 15/859,863, entitled "Wrap Around Silicide for FinFETs," filed on Jan. 2, 2018, now U.S. Pat. No. 10,170,365 issued Jan. 1, 2019, which is a continuation of U.S. patent application Ser. No. 15/221,123, entitled "Wrap Around Silicide for FinFETs," filed on Jul. 27, 2016, now U.S. Pat. No. 9,876,108 issued Jan. 23, 2018, which is a divisional of U.S. patent application Ser. No. 14/739,294, entitled "Wrap Around Silicide for FinFETs," filed on Jun. 15, 2015, now U.S. Pat. No. 9,418,897 issued Aug. 16, 2016, which applications are incorporated herein by reference.

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, three-dimensional transistors such as a Fin Field-Effect Transistors (FinFETs) have been introduced to replace planar transistors. Although existing FinFET devices and methods of fabricating FinFET devices have been generally adequate for their intended purposes, they have not been entirely satisfactory in all respects. Improvements in this area are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 19B are cross-sectional views and perspective views of intermediate stages in the formation of a Fin Field-Effect Transistor (FinFET) in accordance with some exemplary embodiments;

DETAILED DESCRIPTION

Figure 1:
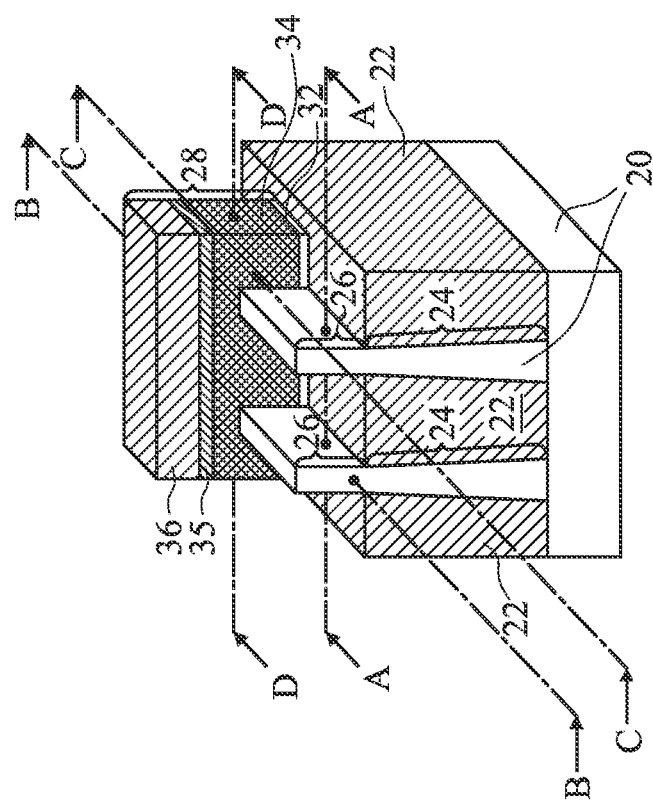

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with various exemplary embodiments. The intermediate stages of forming the FinFET are illustrated. The variations of some embodiments are discussed. Throughout the various views and illustrative embodiments, like reference numbers are used to designate like elements.

Figure 24:
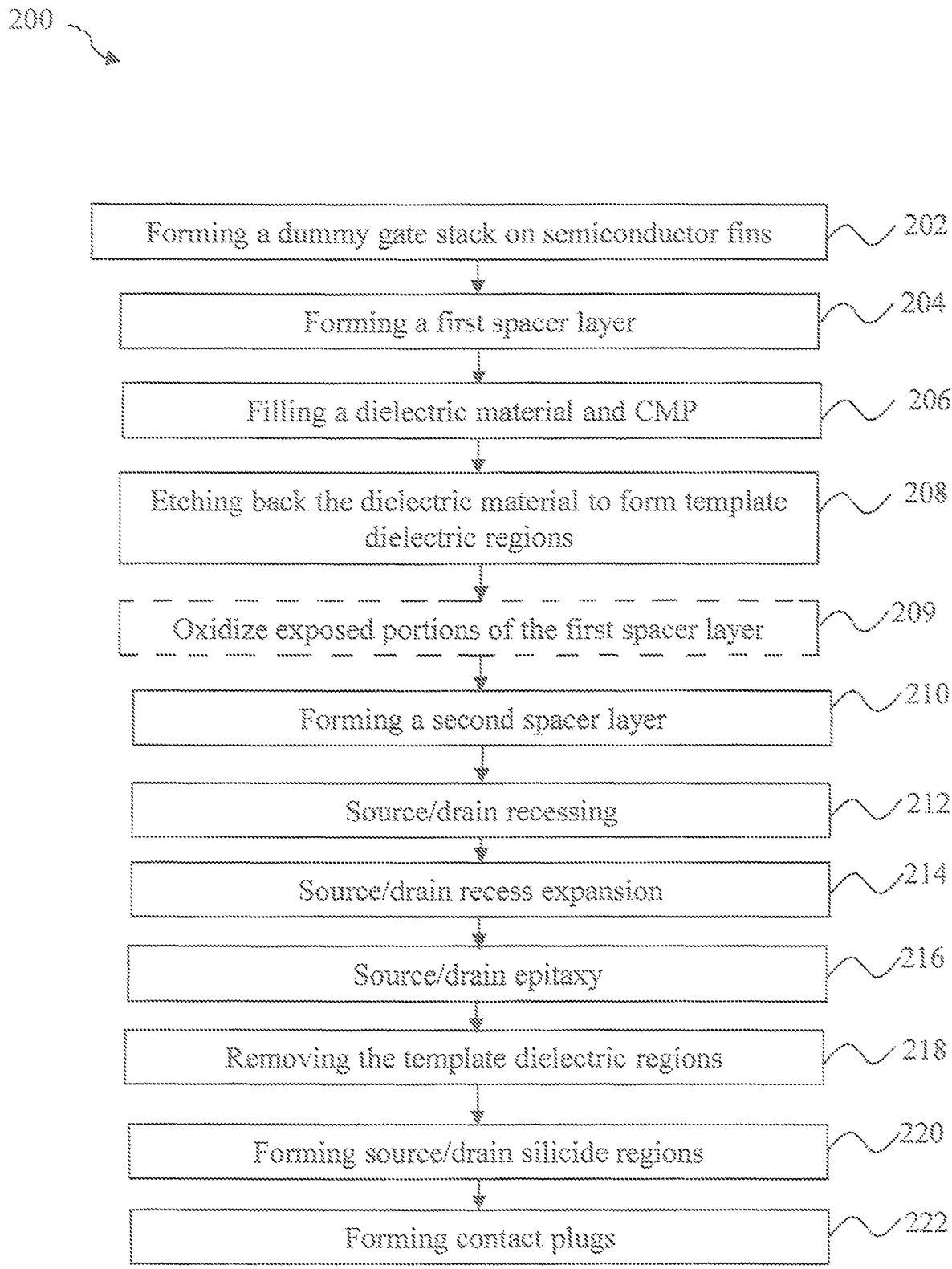
FIG. 24 illustrates a process flow for forming a FinFET in accordance with some embodiments.

FIGS. 1 through 19B illustrate cross-sectional views and perspective views of intermediate stages in the formation of a FinFET in accordance with some embodiments. The steps shown in FIGS. 1 through 19B are also illustrated schematically in the process flow 200 shown in FIG. 24. In the subsequent discussion, the process steps shown in FIGS. 1 through 19B are discussed referring to the process steps in FIG. 24.

FIG. 1 illustrates a perspective view in the formation of a structure including substrate 20, isolation regions 22, semiconductor strips 24 between isolation regions 22, and semiconductor fins 26 over the top surfaces of isolation regions 22. Substrate 20 is a semiconductor substrate, which may further be a silicon substrate, a silicon carbon substrate, or a substrate formed of other semiconductor materials. Substrate 20 may be lightly doped with a p-type or an n-type impurity.

Isolation regions 22 may be, for example, Shallow Trench Isolation (STI) regions. The formation of STI regions 22 may include etching semiconductor substrate 20 to form trenches (not shown), and filling the trenches with a dielectric material to form STI regions 22. STI regions 22 may comprise silicon oxide, and other dielectric materials such as nitrides may also be used. Semiconductor fins 26 overlap the underlying semiconductor strips 24. The formation of semiconductor fins 26 may include recessing STI regions 22, so that the portions of semiconductor material between the removed portions of STI regions 22 become semiconductor fins 26. Semiconductor fins 26 and some or substantially entireties of semiconductor strips 24 may be formed of silicon (with no germanium therein) or other silicon-containing compound including, and not limited to, silicon carbon, silicon germanium, or the like.

Gate stack 28 is formed on semiconductor fins 26. The respective step is shown as step 202 in the process flow shown in FIG. 24. Gate stack 28 covers the middle portions of semiconductor fins 26, and leaving the opposite end portions of semiconductor fins 26 uncovered.

Gate stack 28 includes gate dielectric 32 on the sidewalls and the top surfaces of semiconductor fins 26, and gate electrode 34 over gate dielectric 32. Gate dielectric 32 may be selected from silicon oxide, silicon nitride, gallium oxide, aluminum oxide, scandium oxide, zirconium oxide, lanthanum oxide, hafnium oxide, combinations thereof, and multi-layers thereof. Gate electrode 34 may include a conductive material that includes polysilicon, a refractory metal, or the respective compound including, e.g., Ti, W, TiAl, TaC, TaCN, TaAlC, TaAlCN, TiN, and TiW. In other examples, gate electrode 34 includes nickel (Ni), gold (Au), copper (Cu), or the alloys thereof.

In accordance with some embodiments of the present disclosure, gate stack 28 remains in the final FinFET, and forms the gate stack of the final FinFET. In accordance with alternative embodiments of the present disclosure, gate stack 28 is a dummy gate stack that will be replaced by a replacement gate in subsequent steps. Accordingly, gate stack 28 may include dummy gate electrode (which is also denoted as 34), which may comprise polysilicon, for example. Dummy gate dielectric 32 may, or may not, be formed between dummy gate electrode 34 and semiconductor fins 26.

Gate stack 28 may also include hard masks 35 and 36 formed over gate electrode 34. In accordance with some embodiments, hard mask 35 is formed of silicon oxide, silicon oxycarbo-nitride (SiOCN), or the like. Hard mask 36 may be formed of silicon nitride (SiN) in accordance with some embodiments.

FIGS. 2A through 10C illustrate the intermediate stages in the formation of a FinFET. Each of the figure numbers of FIGS. 2A through 10C includes letter "A," "B," or "C," wherein letter "A" indicates that the respective view is obtained from a plane same as the vertical plane containing line A-A in FIG. 1, and letter "B" indicates that the respective figure is obtained from the plane same as the vertical plane containing line B-B in FIG. 1, and letter "C" indicates that the respective figure is obtained from the plane same as the vertical plane containing line C-C in FIG. 1. Accordingly, the figures whose numbers are followed by letter "A" show the cross-sectional views of source/drain regions, the figures whose number are followed by letter "B" show the cross-sectional views of one of semiconductor fins 26 and the overlying gate, and the figures whose numbers are followed by letter "C" show the cross-sectional views of dummy gate stack 28 at a position not crossing semiconductor fins 26.

Figure 2C:
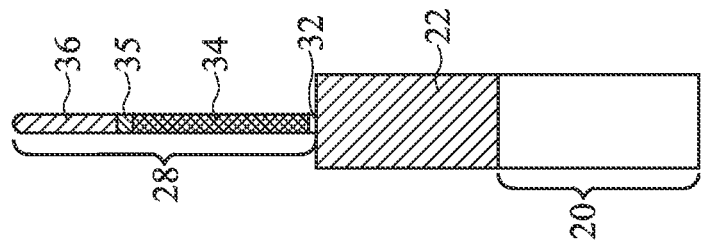
Figure 2B:
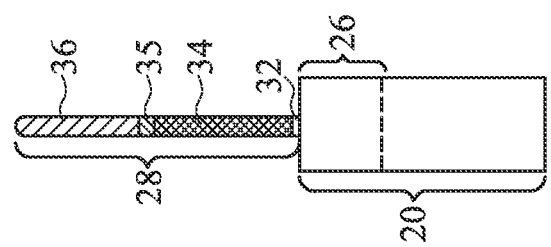
Figure 2A:
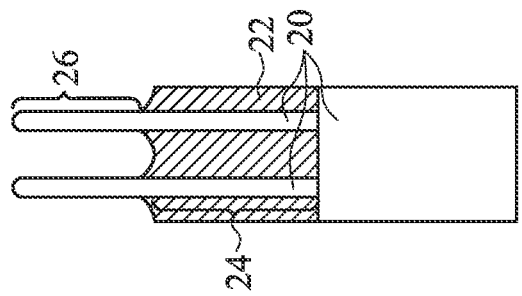

FIGS. 2A, 2B, and 2C illustrate the cross-sectional views obtained from the FIG. 1. Next, referring to FIGS. 3A, 3B, and 3C, spacer layer 38 is formed. Spacer layer 38 is alternatively referred to as the first spacer layer, and the respective spacers are referred to as the first spacers. The respective step is shown as step 204 in the process flow shown in FIG. 24. Spacer layer 38 acts as an etch stop layer in the subsequent formation of contact opening for forming source/drain silicides and source/drain contacts, and hence is alternatively referred to as an etch stop layer. The material of spacer layer 38 is selected to have a high etching selectivity with relative to oxide (such as the subsequently formed template dielectric regions 40 as shown in FIGS. 4A, 4B, and 4C). In accordance with some embodiments of the present disclosure, spacer layer 38 comprises silicon carbonitride (SiCN), while other dielectric materials may be used. Spacer layer 38 may have a thickness in the range between about 3 nm and about 10 nm.

Figure 3C:
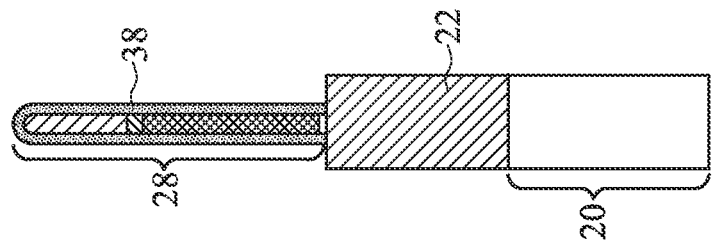
Figure 3B:
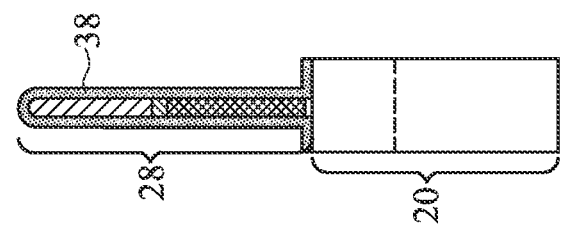
Figure 3A:
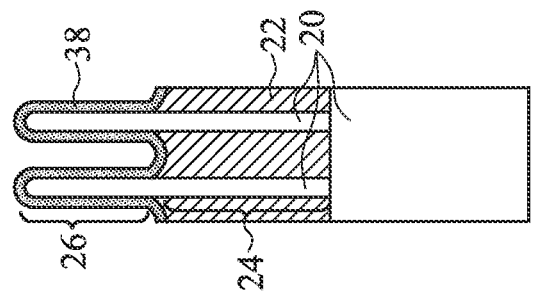
Figure 4C:
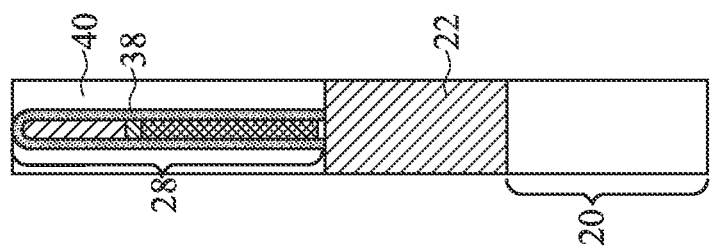
Figure 4B:
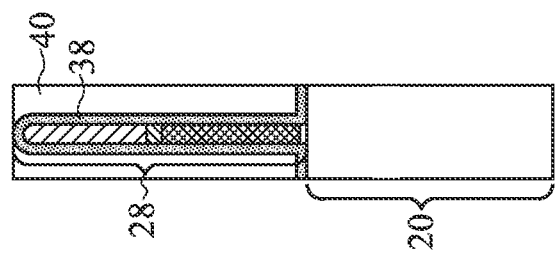
Figure 4A:
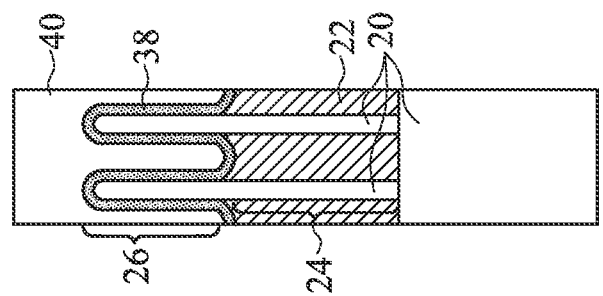

Spacer layer 38 is formed as a conformal layer, and hence covers the top surfaces and the sidewalls of semiconductor fins 26 (FIG. 3A) and gate stack 28 (FIGS. 3B and 3C). The portions of spacer layer 38 on the sidewalls of semiconductor fins 26 are also referred to as fin spacers, as shown in FIG. 3A, and the portions of spacer layer 38 on the sidewalls of semiconductor fins 26 are also referred to as gate spacers hereinafter. In accordance with some embodiments, the thickness of spacer layer 38 is in the range between about 3 nm and about 10 nm.

Next, as shown in FIGS. 4A, 4B, and 4C, template dielectric regions 40 are formed, for example, using Flowable Chemical Vapor Deposition (FCVD). The respective step is shown as step 206 in the process flow shown in FIG. 24. Template dielectric regions 40 may comprise silicon oxide in accordance with some embodiments. The top surface of the remaining template dielectric regions 40 is higher than the top surfaces of semiconductor fins 26 and the top surface of gate stack 28. A planarization such as a Chemical Mechanical Polish (CMP) is then performed to level the top surface of template dielectric regions 40. In the resulting structure, the top surface of template dielectric regions 40 is higher than the top surfaces of semiconductor fins 26, and may be level with or higher than the top ends of gate stack 28 (and the overlying portion of spacer layer 38).

Figure 5C:
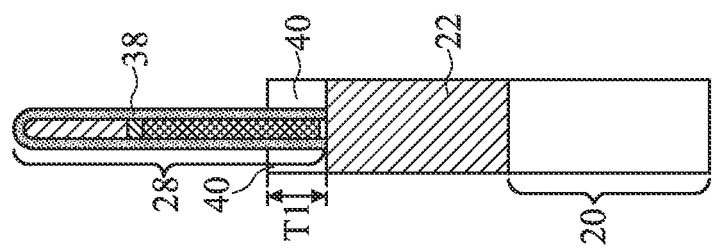
Figure 5B:
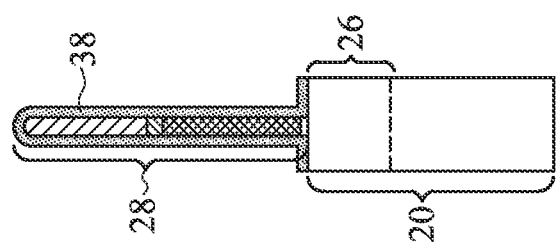
Figure 5A:
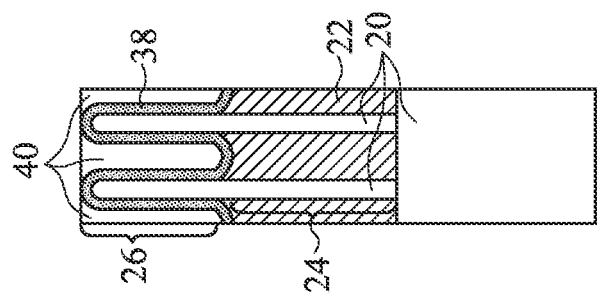

FIGS. 5A, 5B, and 5C illustrate the etch-back of template dielectric regions 40, for example, through wet etch. The respective step is shown as step 208 in the process flow shown in FIG. 24. As a result of the etch-back, as shown in FIG. 5A, the top surfaces of the remaining portions of template dielectric regions 40 are substantially level with or lower than the top surfaces of the portions of spacer layer 38 overlapping semiconductor fins 26. In FIG. 5A, the top surfaces of the top portions of spacer layer 38 may be exposed through template dielectric regions 40. The etching selectivity (the ratio of the etching rate of template dielectric regions 40 to the etching rate of spacer layer 38) is high, for example, higher than about 30. Accordingly, spacer layer 38 remains after the etch-back of template dielectric regions 40. As shown in FIGS. 5B and 5C, the portions of template dielectric regions 40 directly over semiconductor fins 26 (FIG. 5B) are removed. On the other hand, the portion of template dielectric regions 40 directly over STI regions 22 (FIG. 5C) have some portions remaining. In accordance with some embodiments of the present disclosure, thickness T1 of the remaining template dielectric regions 40 is in the range between about 20 nm and about 80 nm.

Figure 22C:
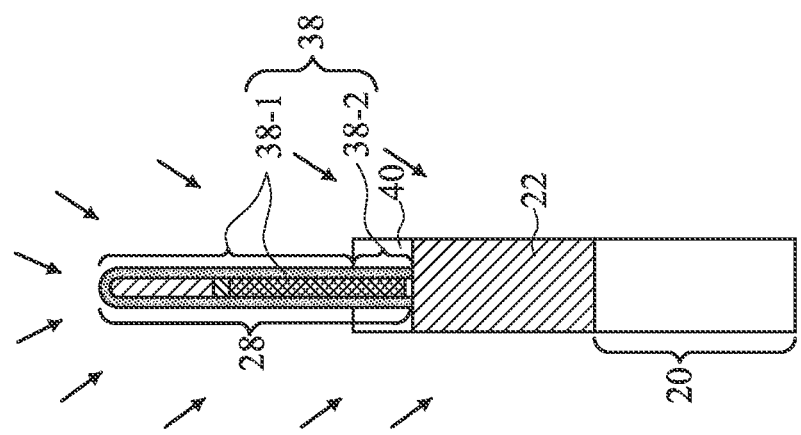
FIGS. 22A, 22B, and 22C are cross-sectional views of an intermediate stage in the formation of a FinFET in accordance with some exemplary embodiments.
Figure 22B:
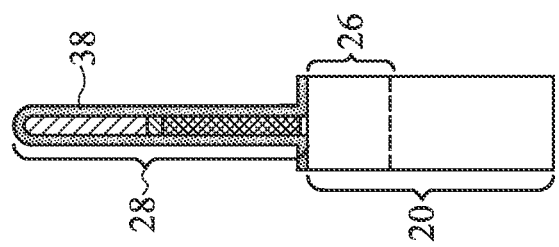
Figure 22A:
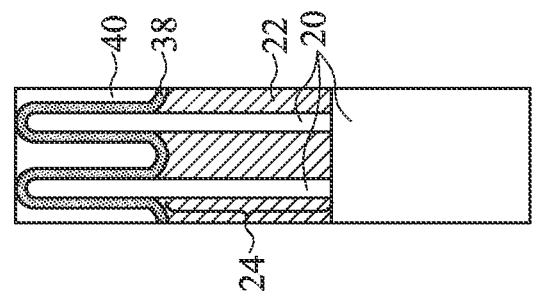

In accordance with some embodiments of the present disclosure, after the process steps in FIGS. 5A, 5B, and 5C, the process step shown in FIGS. 22A, 22B, and 22C is performed, and the exposed portions of spacer layer 38 are oxidized. As a result, the exposed portions of spacer layer 38, are oxidized as portions 38_1 (referred to as oxidized portions 38_1 hereinafter). The respective step is shown as step 209 in the process flow shown in FIG. 24. The box representing step 209 is shown with dashed lines to indicate that this step may be performed or skipped. The unexposed portions 38_2 of spacer layer 38 are not oxidized. When spacer layer 38 is formed of SiCN, the resulting oxidized portions 38_1 comprise silicon oxycarbo-nitride (SiOCN), which has a reduced k value than un-converted portions 38_2. For example, the SiCN may have a k value in the range between about 5.0 and 7.0, and SiOCN may have a k value in the range between about 4.5 and 5.0. The difference in the k values of oxidized portions 38_1 and un-oxidized portions 38_2 may be greater than about 0.5, or greater than about 1.0. The reduction in the k value causes the advantageous reduction in parasitic capacitance. In accordance with some embodiments of the present disclosure, the oxidation of spacer layer 38 is performed using furnace anneal (in an oxygen-containing gas), an oxygen implantation, or the like, wherein the oxidation is illustrated using arrows.

Figure 6C:
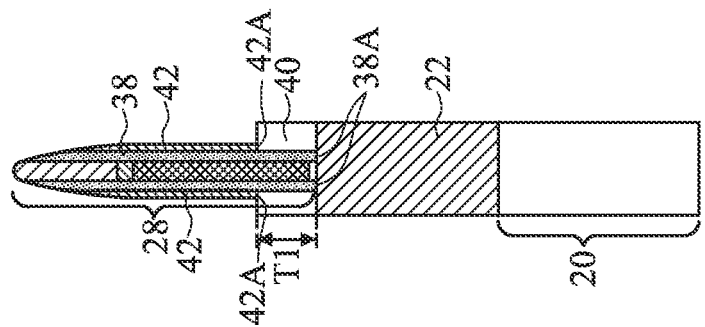
Figure 6B:
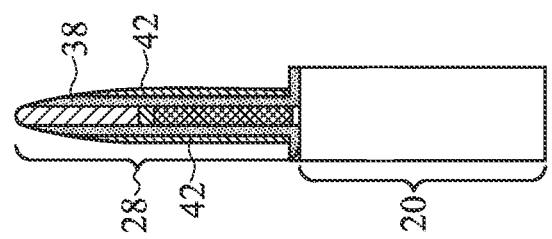
Figure 6A:
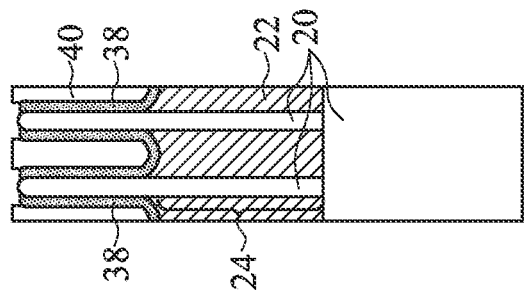

After the process steps in FIGS. 22A, 22B, and 22C, the process step in FIGS. 6A, 6B, and 6C is performed. In accordance with alternative embodiments, after the process steps in FIGS. 5A, 5B, and 5C, the process proceeds to the step shown in FIGS. 6A, 6B, and 6C, while the process step in FIGS. 22A, 22B, and 22C is omitted.

In a subsequent step, as shown in FIGS. 6B and 6C, hard mask spacers 42 are formed. Hard mask spacers 42 are alternatively referred to as the second spacers or second spacer layers. The respective step is shown as step 210 in the process flow shown in FIG. 24. The material of hard mask spacers 42 is selected, so that the etching selectivity (the ratio of the etching rate of hard mask spacers 42 to the etching rate of spacer layer 38) is high, for example, higher than about 30. For example, when spacer layer 38 is formed of SiCN, hard mask spacers 42 may be formed of silicon oxycarbo-nitride (SiOCN), which has a different etching characteristic than SiCN. Furthermore, SiOCN is easier to be removed using wet etching than SiCN.

In accordance with some exemplary embodiments, as shown in FIGS. 6B and 6C, the formation of hard mask spacers 42 includes blanket depositing a conformal hard mask layer, and performing an anisotropic etching to remove the horizontal portions of the hard mask layer. The remaining portions of the hard mask layer are hard mask spacers 42, which are formed on the sidewall portions of spacer layer 38.

As shown in FIG. 6C, spacer layer 38 has some portions buried between gate stack 28 and template dielectric regions 40. The bottom ends 38A of spacer layer 38 contact the top surfaces of STI regions 22. Since hard mask spacers 42 are formed after the formation of template dielectric regions 40, the bottom ends 42A are higher than the top surfaces of template dielectric regions 40. Accordingly, the bottom ends of 42A of hard mask spacers 42 are higher than the bottom ends 38A of spacer layer 38, with the height difference equal to the thickness T1 of template dielectric regions 40, which may be in the range between about 20 nm and about 80 nm.

FIG. 6A also illustrates the removal of the top portions of spacer layer 38. The remaining portions of spacer layer 38 are referred to as (fin) spacers 38 hereinafter. In the cross-sectional view, fin spacers have a U-shape (also including L-shapes).

Figure 7A:
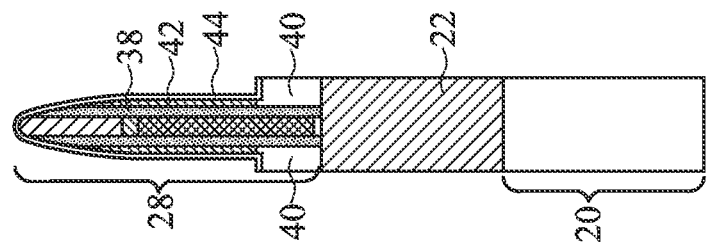
Figure 7B:
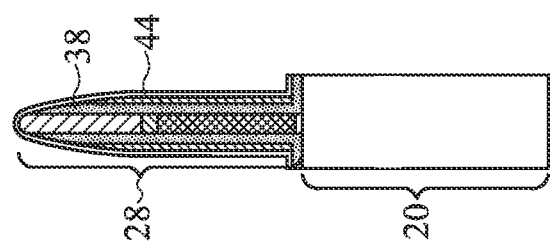
Figure 7C:
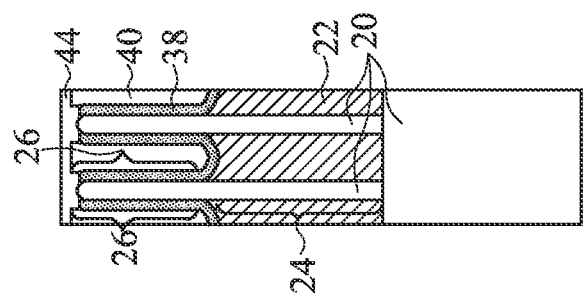

The process flow shown in FIGS. 1 through 6C illustrate the process that and be used in the formation of both PMOS and NMOS devices, although PMOS devices and NMOS devices are physically separated from each other. In the subsequently illustrated formation of source and drain regions, the PMOS and NMOS devices adopt separate process steps. Accordingly, when the source/drain regions of PMOS devices are formed, NMOS devices are masked by mask layer 44, as shown in FIGS. 7A, 7B, and 7C. In accordance with some exemplary embodiments of the present disclosure, mask layer 44 is formed of SiN, and other materials that will not be etched away in the steps shown in FIGS. 8A through 10C may also be used. With PMOS devices or NMOS devices protected by mask layer 44, the process steps proceed to what are shown in FIGS. 8A through 10C. When the process steps shown in FIGS. 8A through 10C are finished for the PMOS devices or NMOS devices, mask layer 44 is removed, and the finished devices will be covered by another mask layer (not shown). The process steps shown in FIGS. 8A through 10C may then be repeated for the other devices.

Figure 8A:
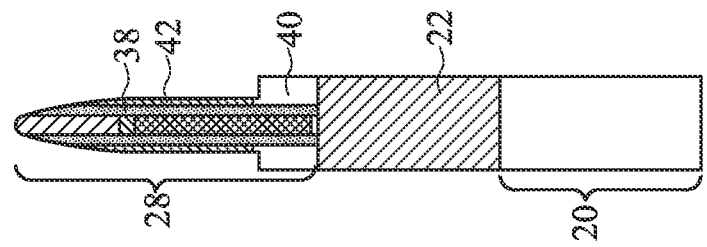
Figure 8B:
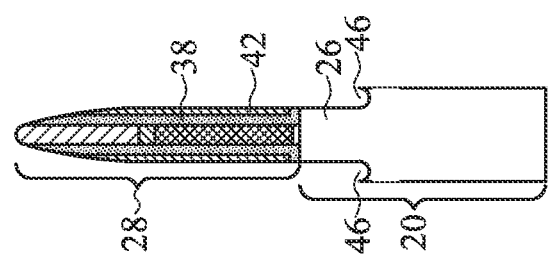
Figure 8C:
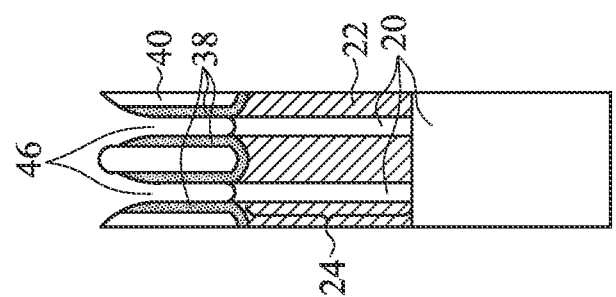

After the step shown in FIGS. 7A, 7B, and 7C, the end portions of semiconductor fins 26 not covered by gate stack 28 (referring to FIGS. 1 and 7A) are recessed in an etching step. The resulting structure is shown in FIGS. 8A, 8B, and 8C. The respective step is shown as step 212 in the process flow shown in FIG. 24. Referring to FIG. 8A, recesses 46 are formed due to the removal of the end portions of semiconductor fins 26. Spacer layer 38 and template dielectric regions 40 are left un-removed, hence defining recesses 46. In accordance with some embodiments, the bottoms of recesses 46 are substantially level with the bottom surfaces of spacer layer 38. In accordance with alternative embodiments of the present disclosure, the bottoms of recesses 46 are higher than or lower than the bottom surfaces of spacer layer 38.

FIG. 8B illustrates that the end portions of semiconductor fins 26 are removed, and the middle portions of semiconductor fins 26 covered by gate stack 28 are left. As shown in FIG. 8C, template dielectric regions 40 remain after the formation of recesses 46.

Figure 9C:
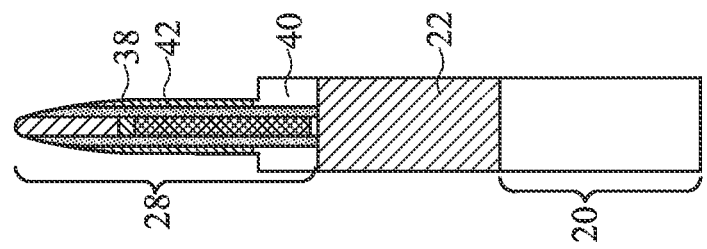
Figure 9B:
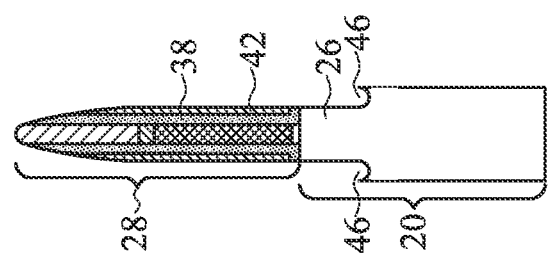
Figure 9A:
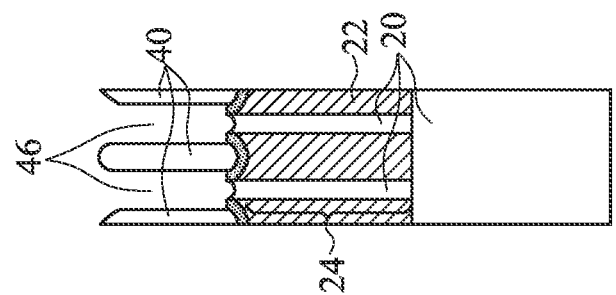

Next, an etching step is performed to remove the sidewall portions of spacers 38 (fin spacers portions of 38) that are exposed to recesses 46, as shown in FIG. 9A. The etching may be isotropic using, for example, wet etching. As a result, the lateral widths of recesses 46 are increased over that in FIG. 8A. The respective step is shown as step 214 in the process flow shown in FIG. 24. This may advantageously increase the widths of source/drain regions subsequently grown in recesses 46. The structure shown in FIGS. 9B and 9C are similar to what are shown in FIGS. 8B and 8C, respectively.

Figure 10A:
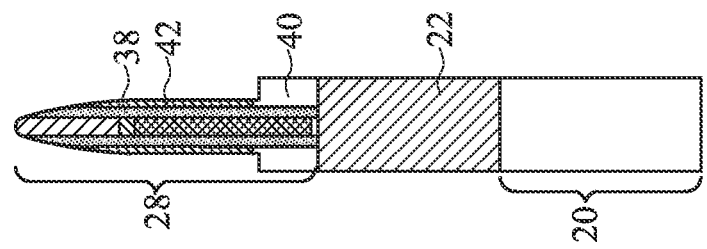
Figure 10B:
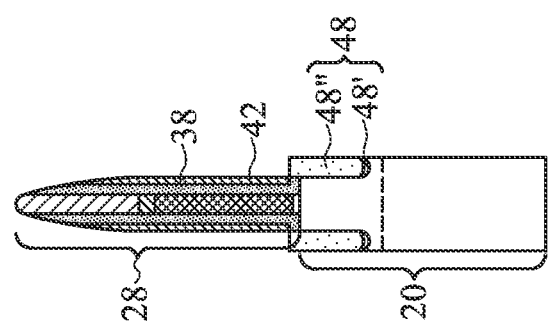
Figure 10C:
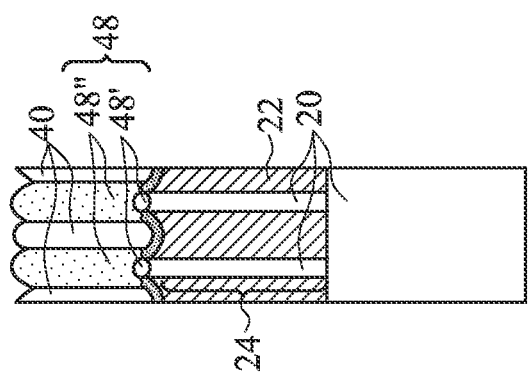

In a subsequent step, source and drain regions (referred to as source/drain regions hereinafter) are epitaxially grown in recesses 46. The resulting structure is shown in FIGS. 10A, 10B, and 10C. The respective step is shown as step 216 in the process flow shown in FIG. 24. In accordance with some embodiments of the present disclosure, the formation of source/drain regions 48 includes an epitaxy growth. When the resulting FinFET is an n-type FinFET, source/drain regions 48 comprise silicon phosphorous (SiP) or phosphorous-doped silicon carbon (SiCP). When the resulting FinFET is a p-type FinFET, source/drain regions 48 may comprise SiGe, and a p-type impurity such as boron or indium may be in-situ doped during the epitaxy. In accordance with some embodiments, source/drain regions 48 include lower portions 48' and upper portions 48" having different percentages of phosphorous, germanium, carbon, or the like, depending on whether source/drain regions 48 belong to PMOS or NMOS devices. Appropriate p-type or n-type impurities may be in-situ doped with the proceeding of the epitaxy, and may (or may not) be implanted into source/drain regions 48 after the epitaxy.

Source/drain regions 48 include straight portions having vertical sidewalls. Furthermore, there may (or may not) be expanded portions of source/drain regions 48 over the straight portions. For example, FIGS. 21A through 21F illustrate that source/drain regions 48 include the straight portions having vertical sidewalls 48A and expanded portions having facets 48B. In accordance with alternative embodiments, source/drain regions 48 do not grow significantly out of recesses 46. Accordingly, source/drain regions 48 do not have expanded portions, and the resulting source/drain regions 48 are similar to what are shown in FIG. 10A. The width of source/drain regions 48 may be in the range between about 6 nm and about 12 nm. The height of source/drain regions 48 may be in the range between about 30 nm and about 80 nm.

In the formation of source/drain regions 48, template dielectric regions 40 are used as a template to confine the formation of sourced/drain regions 48, so that source/drain regions 48 have straight sidewalls, and the expanded portions are minimized, if formed at all.

FIGS. 11 through 16 illustrate the formation of source/drain silicide regions, Inter-Layer Dielectric (ILD), and contact plug in a silicide-first process in accordance with some embodiments. In the silicide-first process, source/drain silicide regions are formed before the formation of ILD. FIG. 11 illustrates a portion of the structure shown in FIG. 10A. Next, a, etching (such as a dry etching) is performed to remove template dielectric regions 40 between source/drain regions 48, and the resulting structure is shown in FIG. 12. The respective step is shown as step 218 in the process flow shown in FIG. 24. In the etching step, spacers 38 are used as an etch stop layer. Since spacers 38 have a high etching selectivity relative to template dielectric regions 40, spacers 38 effectively protect the underlying STI regions 22.

Next, as shown in FIG. 13, a silicidation process is performed to form silicide regions 50 on the sidewalls of source/drain regions 48. The respective step is shown as step 220 in the process flow shown in FIG. 24. In accordance with some embodiments of the present disclosure, the silicide regions comprise nickel silicide, titanium silicide, cobalt silicide, or the like. The thickness of silicide regions 50 may be in the range between about 2 nm and about 8 nm.

Figure 14:
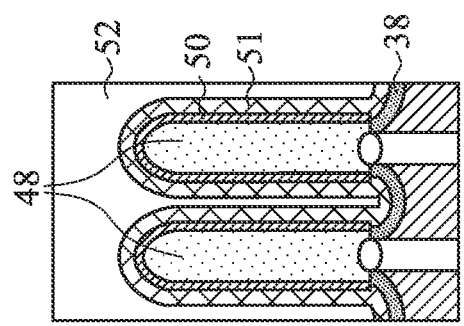

Next, as shown in FIG. 14, blocking layer 51 and ILD 52 are formed. A CMP is then performed to level the top surfaces of ILD 52. Blocking layer 51 may be formed of amorphous silicon. ILD 52 may be formed of a FCVD oxide, which may be silicon oxide. In accordance with alternative embodiments, ILD 52 is formed of PhosphoSilicate Glass (PSG), BoroSilicate Glass (BSG), Boron-doped Phospho-Silicate Glass (BPSG), Fluorine-doped Silicate Glass (FSG), TetraEthyl OrthoSilicate (TEOS), or the like. An annealing is then performed, resulting in the structure shown in FIG. 15. During the annealing, blocking layer 51 absorbs the oxygen in ILD 52, and hence is converted to oxide. On the other hand, silicide regions 50 are protected by blocking layer 51 from being oxidized.

Figure 20:
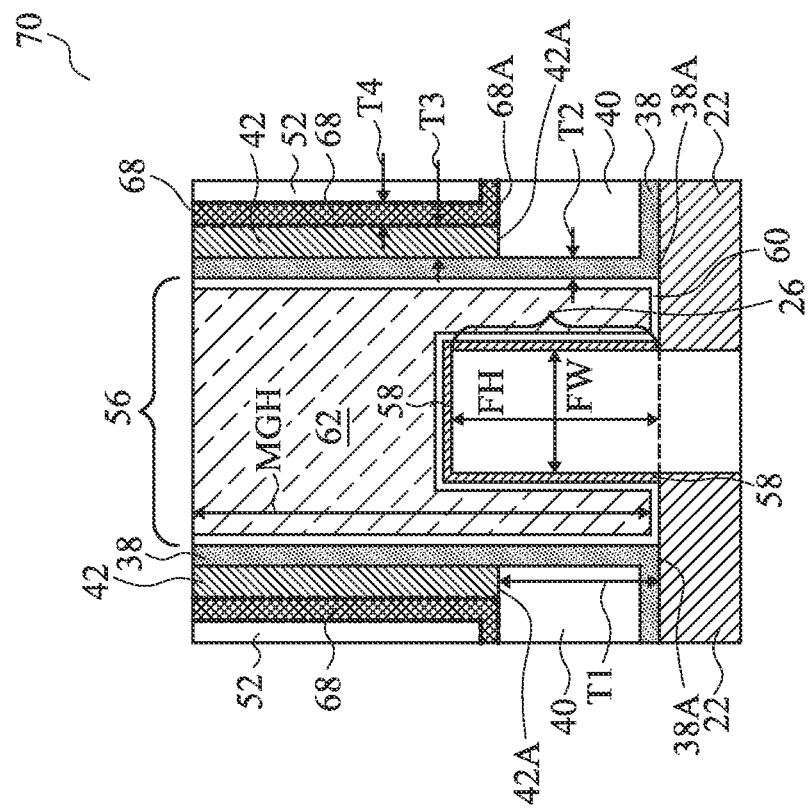
FIG. 20 illustrates a cross-sectional view of a FinFET in accordance with some embodiments.

After the formation of ILD 52, a replacement gate is formed. First, the dummy gate stack 28 shown in FIGS. 10B and 10C are removed, forming an opening in ILD 52 as in FIG. 15. A replacement gate is formed in the opening left by the removed dummy gate stack 28. The resulting structure is shown in FIG. 20. Replacement gate 56 includes interfacial layer 58, high-k gate dielectric 60, and gate electrode 62 in accordance with some embodiments. Interfacial layer 58 may be formed of silicon oxide. High-k gate dielectric 60 may be formed of a high-k dielectric having a k value greater than about 7.0, and may include a metal oxide or a silicate of Hf, Al, Zr, La, and the like. Gate electrode 62 may include a plurality of layers formed of materials such as TiN, TaN, TiAl, cobalt, and Al.

Figure 16:
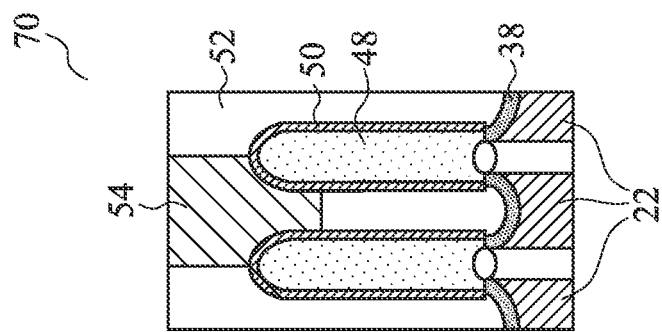
Figure 15:
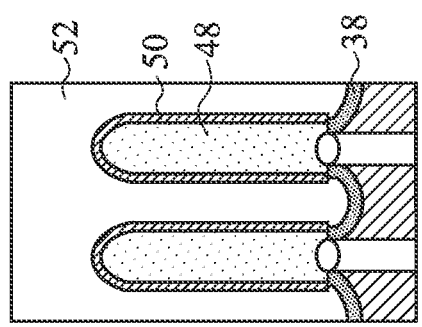

After the formation of replacement gate 56, contact plug 54 is formed, as shown in FIG. 16. The respective step is shown as step 222 in the process flow shown in FIG. 24. The formation process includes forming a contact opening in ILD 52, and filling the contact opening with contact plug 54. The formation of the FinFET 70 is thus finished.

FIGS. 17 through 20 illustrate the formation of source/drain silicide regions, ILD, and contact plugs in a silicide-last process in accordance with alternative embodiments. In the silicide-last process, source/drain silicide regions are formed after the formation of ILD, and are formed through the contact opening. FIG. 17 again illustrates a portion of the structure shown in FIG. 10A. Next, referring to FIG. 18, Contact Etch Stop Layer (CESL) 68 is formed, followed by the formation of ILD 52. CESL 68 may be formed of silicon nitride or other dielectric materials. CESL 68 resides on the remaining portions of template dielectric regions 40. In addition, as show in FIG. 20, CESL 68 is also formed on the sidewalls of hard mask spacers 42. Furthermore, CESL 68 includes portions overlapping template dielectric regions 40, with the bottom surface 68A of CESL 68 contacting the top surfaces of template dielectric regions 40. The bottom surfaces 68A are also higher than the bottom ends 38A of spacers 38. In FIG. 20, CESL 68 is illustrated using dashed lines to indicate that they may be formed when the silicide-last process is adopted, and may not be formed when the silicide-first process is adopted.

After the formation of CESL 68 and ILD 52, the replacement gate 56 is formed, wherein replacement gate 56 is similar to what is shown in FIG. 20.

Figure 18:
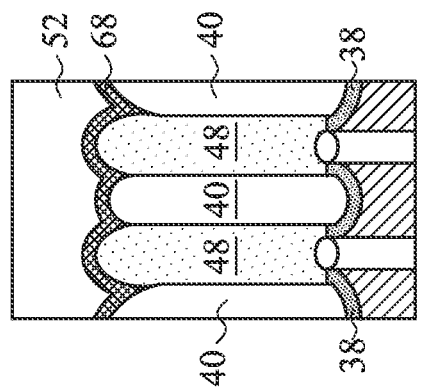
Figure 17:
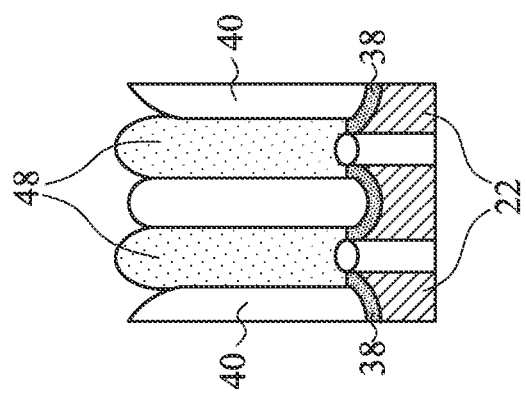
Figure 19A:
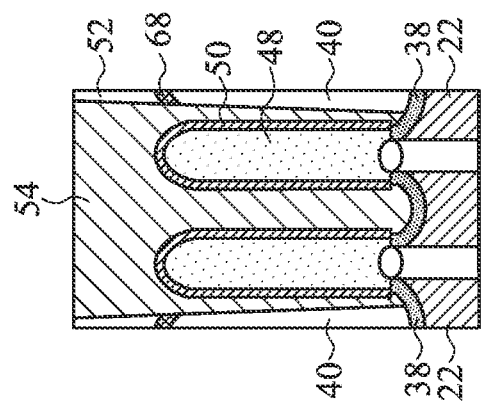
Figure 19B:
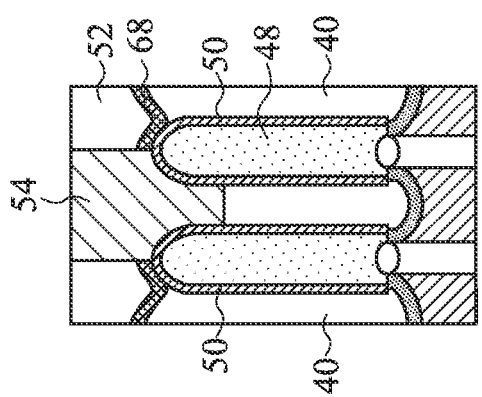

FIGS. 19A and 19B illustrate the contact plug 54 formed from the structure shown in FIG. 18 in accordance with some embodiments. As shown in FIG. 19A, contact plug 54 is overlapping, and is in contact with, a remaining template dielectric region 40. In these embodiments, in the formation of the contact opening, the dielectric region 40 exposed to the contact opening is not fully removed. FIG. 19B illustrates the structure in accordance with alternative embodiments, wherein an entirety of one template dielectric regions 40 exposed to the contact opening is removed, and hence contact plug extends to contact spacers 38. There may also be other remaining template dielectric regions 40.

FIG. 20 illustrates a cross-sectional view of the resulting FinFET 70. The cross-sectional view is obtained from the same vertical plane that contains line D-D in FIG. 1. Also, for simplicity, a single fin 26 is shown in FIG. 20, although FIG. 1 illustrates two fins 26. It is realized that when spacers 38 (FIGS. 3A through 3C), template dielectric regions 40 (FIGS. 4A through 5C), hard mask layer 42 (FIGS. 6A through 6C), and CESL 68 (FIG. 18) are formed, these features are also simultaneously formed on the left-end sidewall and the right-end sidewall of gate stack 28 (refer to FIG. 1). Accordingly, FIG. 20 illustrates these portions of spacers 38, template dielectric regions 40, hard mask layer 42, and CESL 68.

As shown in FIG. 20, spacers 38 extend from the top surface to the bottom surface of replacement gate 56, with the bottom surfaces 38A being on the top surfaces of STI regions 22. Template dielectric regions 40 are formed overlapping STI regions 22. Hard mask layers 42 have bottom surfaces contacting the top surfaces of template dielectric regions 40. The bottom surfaces 42A of hard mask layers 42 are further higher than the bottom surface/ends 38A of spacers 38. The bottom surfaces 68A of CESL 68 (if formed)

will also contact the top surfaces of template dielectric regions 40, and hence are also higher than the bottom ends 38A of spacers 38.

In accordance with some embodiments, channel fin height FH of FinFET 70 is in the range between about 30 nm and about 80 nm. Channel fin width FW may be in the range between about 1 nm and about 12 nm. Each of thickness T2 of spacer 38, thickness T3 of hard mask layer 42, and thickness T4 of CESL 68 may be in the range between about 1 nm and about 10 nm. The ratio of spacer height difference T1 to fin height FH may be in the range between about 0.6 and about 1. The ratio of spacer height difference T1 to height MGH of replacement gate 56 may be in the range between about 0.1 and about 0.3.

Figure 21A:
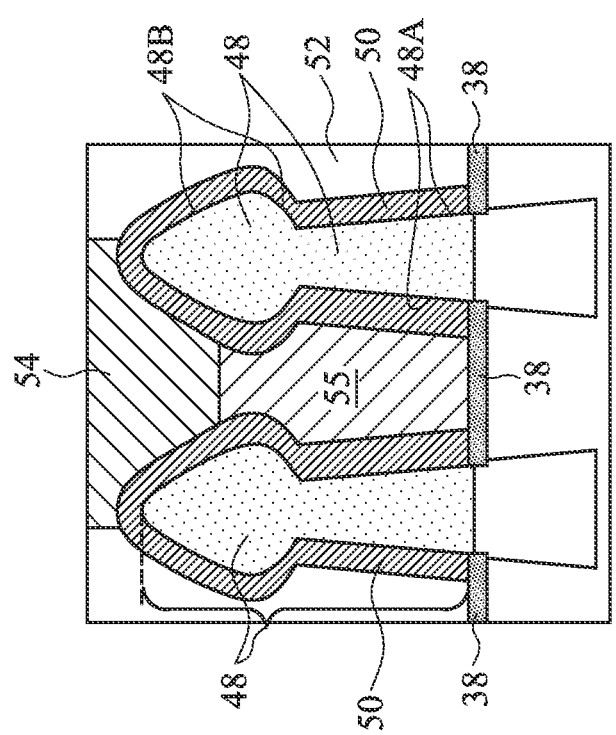
FIGS. 21A through 21F are cross-sectional views of source/drain silicide regions of FinFETs in accordance with some exemplary embodiments.
Figure 21B:
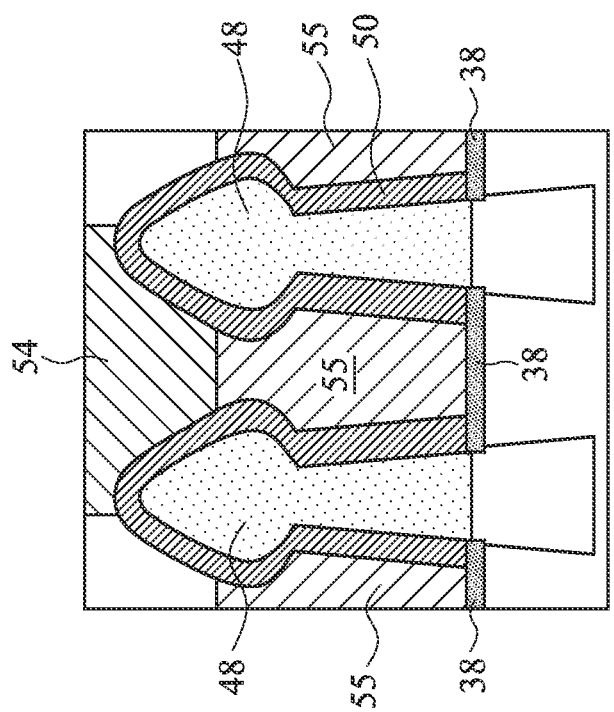
Figure 21C:
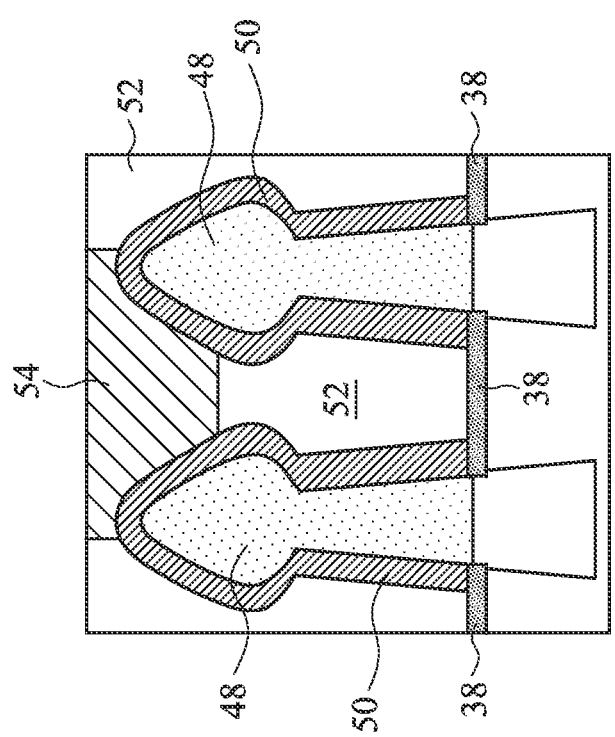

FIGS. 21A through 21F illustrate the profiles of source/drain silicide regions 50 and contact plugs 54 in accordance with various embodiments. FIGS. 21A, 21B, and 21C illustrate the silicide regions 50 and contact plugs 54 formed using silicide-first processes. Accordingly, since silicide regions 50 have already been formed when contact openings are formed, the contact openings can be formed small. For example, in FIGS. 21A, 21B, and 21C, contact plugs 54 are smaller than the combined region that includes two source/drain regions 48 and the region therebetween. As a comparison, in FIGS. 21D through 21F (silicide last process), contact plugs 54 are larger than the combined region that includes two source/drain regions 48 and the region therebetween. This is because in the silicide-last approach, the contact opens will be large enough so that the silicide regions may be formed in the contact openings.

Figure 21D:
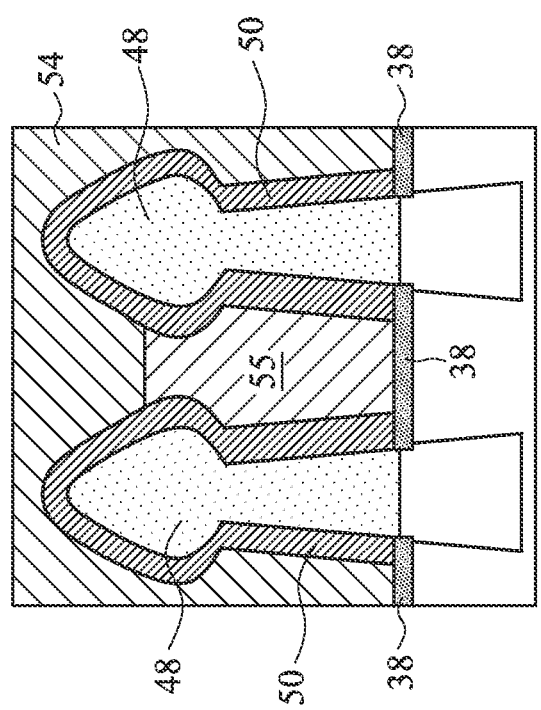
Figure 21E:
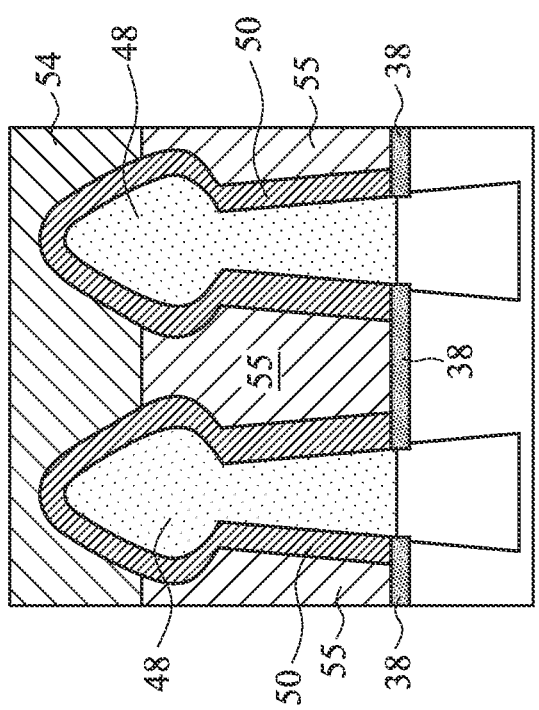
Figure 21F:
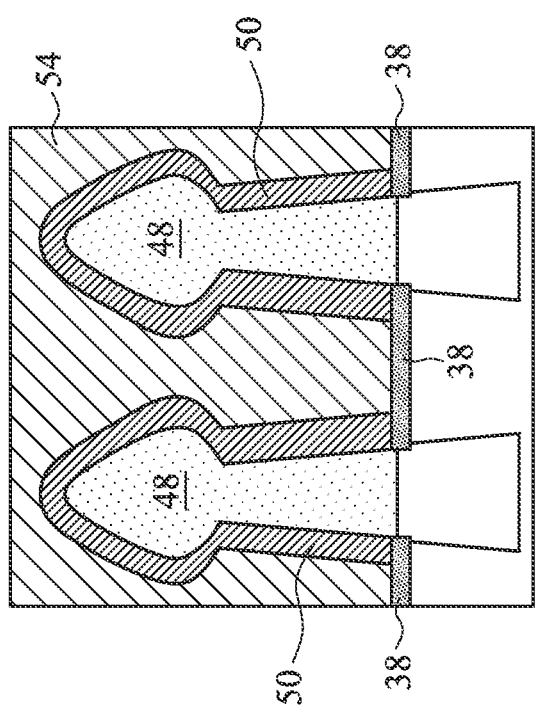

FIGS. 21A, 21B, 21D, and 21E illustrate that the remaining metal 55 used to form the silicide regions 50 is left un-removed after the formation of silicide regions 50. Furthermore, FIGS. 21A and 21D illustrate that metal 55 is limited between source/drain regions 48, while FIGS. 21B and 21E illustrate that metal 55 expand beyond the outmost source/drain regions 48. FIG. 21C illustrates that ILD 52 remains under contact plug 54, and FIG. 21F illustrates that contact plug 54 extends all the way to spacer 38.

Figure 23:
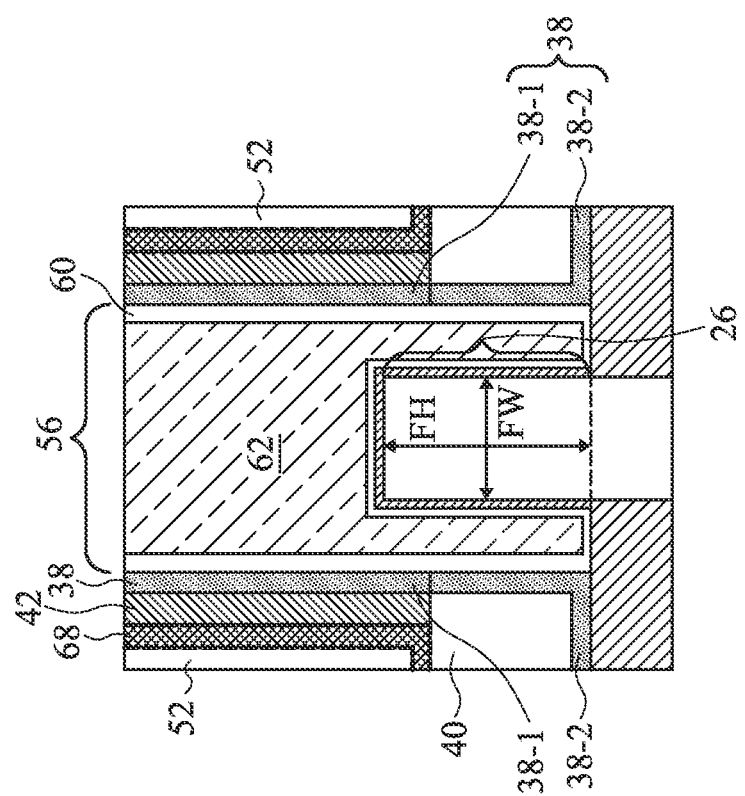
FIG. 23 illustrates a cross-sectional view of a FinFET in accordance with some embodiments.

FIG. 23 illustrates a cross-sectional view of the FinFET 70 in accordance with some embodiments. The FinFET 70 in accordance with some embodiments is obtained by performing the steps shown in FIGS. 22A, 22B, and 22C (step 209 in FIG. 24). Accordingly, the resulting hard mask layer 42 includes oxidized upper portion 38_1 and un-oxidized lower portion 38_2, which have a higher k value than the oxidized portions 38_1. Referring to FIG. 22C, the interface between the oxidized upper portion 38_1 and un-oxidized lower portion 38_2 is substantially level with (for example, with a height difference smaller than about 2 nm) the top surface of template dielectric regions 40. In accordance with alternative embodiments, the interface between the oxidized upper portion 38_1 and un-oxidized lower portion 38_2 is lower than the top surface of template dielectric regions 40.

The embodiments of the present disclosure have some advantageous features. By forming a dielectric region to act as the template for source/drain epitaxy, the resulting source/drain regions have straight sidewalls, and hence silicide regions may be formed more uniformly on all sidewalls and top surfaces of the source/drain regions. The source/drain contact resistance is thus reduced, and the drive current of the FinFET is increased.

In accordance with some embodiments of the present disclosure, a method includes forming a gate stack on a middle portion of s semiconductor fin, and forming a first gate spacer on a sidewall of the gate stack. After the first gate spacer is formed, a template dielectric region is formed to cover the semiconductor fin. The method further includes recessing the template dielectric region. After the recessing, a second gate spacer is formed on the sidewall of the gate stack. The end portion of the semiconductor fin is etched to form a recess in the template dielectric region. A source/drain region is epitaxially grown in the recess.

In accordance with alternative embodiments of the present disclosure, a method includes forming a gate stack on a middle portion of s semiconductor fin, and forming a gate spacer on a sidewall of the gate stack. After the first gate spacer is formed, a template dielectric region is formed, with a top surface of the template dielectric region being substantially level with a top surface of the semiconductor fin. The end portion of the semiconductor fin is etched to form a recess in the template dielectric region. A source/drain region is epitaxially grown in the recess. The method further includes removing at least a portion of the template dielectric region to expose sidewalls of the source/drain region, and siliciding the sidewalls of the source/drain region.

In accordance with alternative embodiments of the present disclosure, a FinFET includes a semiconductor fin, a gate on a sidewall and a top surface of the semiconductor fin, a first gate spacer extending from a top surface to a bottom surface of the gate, and a second gate spacer extending from the top surface of the gate to a level higher than the bottom surface of the gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a substrate;
a dielectric isolation region extending into the substrate;
a semiconductor strip between and contacting opposing portions of the dielectric isolation region;
a gate structure on the substrate;
a first spacer adjacent to and directly contacting the gate structure, wherein the first spacer comprises silicon carbo-nitride (SiCN), and the first spacer has an L-shape;
a second spacer adjacent to and directly contacting the first spacer, wherein the second spacer comprises silicon oxycarbonitride (SiOCN), and wherein the second spacer comprises;
a vertical-and-straight inner edge; and
an outer edge comprising a vertical-and-straight portion;
a source/drain region adjacent to two sides of the second spacer, wherein the source/drain region overlaps the semiconductor strip, and wherein the source/drain region comprises:
a first vertical-and-straight sidewall; and
a second vertical-and-straight sidewall parallel to the first vertical-and-straight sidewall, wherein the source/drain region is wider than the semiconductor strip; and a top dielectric layer over and contacting a top surface of the dielectric isolation region, wherein the top dielectric layer comprises SiCN, wherein the top dielectric layer further extends directly underlying the source/drain region.

2. The semiconductor device of claim 1, wherein an outmost edge of the first spacer is vertically aligned to the vertical-and-straight portion of the outer edge of the second spacer.

3. The semiconductor device of claim 2, wherein the outmost edge of the first spacer and the vertical-and-straight portion of the outer edge of the second spacer are further vertically aligned to an inner edge of the source/drain region.

4. The semiconductor device of claim 1, wherein the top dielectric layer is in physical contact with a bottom surface of the source/drain region.

5. The semiconductor device of claim 1, wherein bottoms of the first vertical-and-straight sidewall and the second vertical-and-straight sidewall are in contact with the top dielectric layer.

6. The semiconductor device of claim 1, wherein the source/drain region extends laterally beyond opposing edges of the semiconductor strip.

7. The semiconductor device of claim 1, wherein both of the first spacer and the second spacer have curved top surfaces.

8. The semiconductor device of claim 1, wherein the second spacer overlaps a horizontal leg of the first spacer.

9. The semiconductor device of claim 1, wherein the top dielectric layer and the first spacer are portions of a continuous dielectric layer.

10. The semiconductor device of claim 1, wherein the top dielectric layer is curved.

11. The semiconductor device of claim 10, wherein a topmost end of the top dielectric layer contacts a bottom of the source/drain region.

12. A semiconductor device comprising:
a semiconductor substrate comprising a semiconductor region;
a dielectric region extending into the semiconductor substrate, wherein the dielectric region comprises:
a bottom portion; and
a top surface layer over the bottom portion, wherein the bottom portion and the top surface layer are formed of different materials;
a gate stack on the semiconductor region;
a gate spacer contacting a sidewall of the gate stack, wherein the gate spacer comprises:
a first spacer comprising silicon carbo-nitride (SiCN), wherein the first spacer comprises a vertical leg and a horizontal leg joined to a bottom end of the vertical leg; and
a second spacer overlapping the horizontal leg of the first spacer, wherein the second spacer comprises silicon oxycarbonitride (SiOCN);
a source/drain region on a side of the gate spacer, wherein in a vertical cross-section that is parallel to a lengthwise direction of the gate stack and intercepts the source/drain region, substantially an entirety of the top surface layer of the dielectric region is lower than the source/drain region; and
a semiconductor strip between and contacting opposing portions of the dielectric region, wherein the semiconductor strip forms a vertical edge with the dielectric region, wherein the source/drain region overlaps the vertical edge of the semiconductor strip, and wherein the source/drain region comprises a first vertical-and-straight sidewall and a second vertical-and-straight sidewall parallel to each other, wherein the first vertical-and-straight sidewall and the second vertical-and-straight sidewall are further parallel to the vertical edge, and wherein bottoms of the first vertical-and-straight sidewall and the second vertical-and-straight sidewall are in physical contact with the top surface layer.

13. The semiconductor device of claim 12, wherein the horizontal leg of the first spacer is over and in physical contact with the semiconductor region.

14. The semiconductor device of claim 12, wherein the top surface layer comprises SiCN.

15. The semiconductor device of claim 12, wherein the source/drain region is wider than the semiconductor strip.

16. The semiconductor device of claim 12, wherein the top surface layer is curved.

17. The semiconductor device of claim 16, wherein a topmost end of the top surface layer contacts a bottom of the source/drain region.

18. A device comprising:
a semiconductor region;
a gate stack over and physically contacting the semiconductor region;
a gate spacer comprising:
an inner layer comprising silicon carbo-nitride (SiCN); and
an outer layer separated from the gate stack by the inner layer, wherein the outer layer comprises silicon oxycarbonitride (SiOCN);
a source/drain region on a side of the gate spacer; and
a SiCN layer extending directly underlying, and in physical contact with an edge portion of the source/drain region, wherein the inner layer and the SiCN layer are portions of a same continuous dielectric layer.

19. The device of claim 18, wherein the inner layer further comprises an extension portion directly underlying the outer layer.

20. The device of claim 18 further comprising:
a semiconductor strip underlying and overlapped by the source/drain region, wherein a first vertical middle line of the semiconductor strip is vertically aligned to a second vertical middle line of the source/drain region, and wherein the source/drain region comprises a first vertical-and-straight sidewall and a second vertical-and-straight sidewall parallel to each other, and the source/drain region is wider than the semiconductor strip.

* * * * *